(12) United States Patent  
Bachle

(10) Patent No.: US 6,989,727 B2  
(45) Date of Patent: Jan. 24, 2006

(54) LOCKING SYSTEM OF A SAFETY SWITCH COMPRISING A READING HEAD AND AN ACTUATOR

(75) Inventor: Erik Bachle, Filderstadt (DE)

(73) Assignee: Euchner GmbH & Co. KG, Leinfelden-Echterdingen (DE)

( * ) Notice: Subject to any disclaimer, the term of this patent is extended or adjusted under 35 U.S.C. 154(b) by 0 days.

(21) Appl. No.: 10/473,124

(22) PCT Filed: Sep. 17, 2002

(86) PCT No.: PCT/EP02/10402

§ 371 (c)(1),  
(2), (4) Date: Sep. 29, 2003

(87) PCT Pub. No.: WO03/025963

PCT Pub. Date: Mar. 27, 2003

(65) Prior Publication Data

US 2004/0245855 A1 Dec. 9, 2004

(30) Foreign Application Priority Data

Sep. 18, 2001 (DE) ................................ 101 46 828

(51) Int. Cl.  
*H01H 9/00* (2006.01)

(52) U.S. Cl. ..................... 335/205; 200/43.07; 307/116

(58) Field of Classification Search ........ 335/205–207, 335/220–234, 177–179; 307/112, 116, 326, 307/119; 200/43.04–43.07, 332.1, 334  
See application file for complete search history.

(56) References Cited

U.S. PATENT DOCUMENTS

| 4,790,158 A | * | 12/1988 | Dirks ......................... 70/139 |
| 5,254,879 A | | 10/1993 | Jackson |
| 5,894,116 A | * | 4/1999 | Da Dalt ................... 200/43.04 |

FOREIGN PATENT DOCUMENTS

DE 3324242 1/1985

* cited by examiner

Primary Examiner—Lincoln Donovan

(74) Attorney, Agent, or Firm—Roylance, Abrams, Berdo & Goodman, L.L.P.

(57) ABSTRACT

A locking system is for a safety switch. The switch has a reading head (2) and an actuator (3) with first and second modules (10, 14) containing electric and/or electronic components. The components can be caused to interact electrically in a contactless manner to control the safety switch. The actuator (3) can be locked on the reading head (2) by a controllable electromagnet (7), which cooperates with a counterelement (12). The counter-element (12) and/or the electromagnet (7) is/are connected in a fixed manner to a corresponding base element (13), which is fixed to the actuator (3) or reading head (2), but can be pivoted in relation to the base element. The first and/or second module (10, 14) is/are integrated into the respective counter-element (12).

14 Claims, 5 Drawing Sheets

LOCKING SYSTEM OF A SAFETY SWITCH COMPRISING A READING HEAD AND AN ACTUATOR

BACKGROUND OF THE INVENTION

Such safety switches may be used to monitor movable protective devices such as doors, covers, gratings, and the like of machines and assemblies. When the protective device is opened, the safety switch generally interrupts one or more electric circuits, transferring the associated machine to a safe operating state. For example, the machine is switched off, or starting of the machine is prevented.

Wide use is made of safety switches in which an actuator, generally rigidly connected to the protective device, may be introduced into a reading head of the housing of the safety switch. Introduction of the actuator customarily requires in any event partial positive locking of actuator to reading head, and directly or indirectly effects switching of the safety switch by mechanical coupling elements. Such positive locking represents a kind of mechanical coding so that the safety switch may be actuated only by a predetermined actuator. The protective device may be locked by locking the actuator in the reading head. The locking may, for example, be electromechanically drivable and/or electromechanically unlockable.

DE 43 28 297 C1 discloses a safety switch in which the switching tappet is at the same time configured as armature of the electromagnet actuating the locking mechanism.

DE 697 775 T2 discloses a safety switch in which the actuator may be mechanically locked in the safety switch. A locking slide is displaceable transversely to the longitudinal axis of the switching tappet, is guided in the housing of the safety switch, is electromagnetically actuatable, and may be brought into blocking engagement with the switching tappet below the reading head. The locking slide operates in conjunction with the electromagnetic drive by a coupling device with a reversible actuating ramp. The reversibility of the actuating ramp makes it possible to predetermine whether the locking takes place with the electromagnetic drive voltage-free or under voltage (NORMALLY LOCKED or NORMALLY UNLOCKED).

DE 697 07 081 t2 discloses a safety switch in which the reading head may be fixed to the housing of the safety switch in various predetermined angular positions.

Other such or similar safety switches are disclosed in DE 33 09 372 C2, DE 199 19 949 A1, DE 3429647 C2, and DE 3923663 A1.

Safety switches of a modified type include a reading head and an actuator, each having a first and/or second module with electric and/or electronic components. The components may be caused to interact without electric contact, and accordingly, control the safety switch, are disclosed in DE 197 11 588 A1, for example.

After assembly, the actuator in the reading head may be locked by mechanical means, and as a result, the protective device may be locked. On the basis of the state of the art, the locking takes place, for example, by extension of a tappet in the reading head through an opening in the actuator. In order that the locking forces required, of N for example, may be applied, as a function of the application, the locking system and accordingly the safety switch must be of suitable rugged design.

The actuator is introduced into a channel formed by the reading head. In fouling environments, such as in the vicinity of metal-cutting machine tools, the fouling of the safety switch and of the locking system which occurs may impair preparation of high locking forces and other functions as well.

DE 199 53 898 A discloses an access protection device in which the locking system consists of a magnetic circuit which comprises a magnetizable yoke positioned on the movable component and a U-shaped magnet which may be locked on the yoke. The magnetic action of the magnet may be switched on and off.

SUMMARY OF THE INVENTION

Objects of the present invention are to provide an improved locking system of a safety switch, and in particular, to obtain high locking forces at low design cost.

Other objects of the present invention are to provide a locking system for a safety switch where the operation of the locking system and of the safety switch is to be ensured even in a fouling environment and where there is full use of the spatial response area of the interacting system as a function of the application.

These objects are basically attained by a locking system where the actuator may be locked on the reading head by an engaging and disengaging electromagnet operated in conjunction with a counterelement. The counterelement and/or the electromagnet is/are rigidly connected to an associated base element, but may be pivoted relative to the base element. A first and/or second module is/are integrated into the respective counterelement.

Consequently, the locking is not effected, or in any event not exclusively effected, by a bolt movable transversely to the direction of movement of the actuator. Rather, locking is effected by action of electromagnetic force on the counterelement. The electromagnet may be engaged and disengaged by the safety switch itself and/or by an associated control device and/or by the machine associated with the safety switch. The level of the locking force is adjustable, for example, as a function of the operational status of the associated machine. In that the counterelement and/or the electromagnet is/are mounted pivotably relative to the base element, in the process of locking, when the electromagnet and the actuator are brought into such close vicinity, sufficiently high locking forces may be generated. In that first and/or second module is/are integrated into the respective counterelement, interaction of the modules even under unfavorable circumstances is reliably ensured, for example, even in the event of displacement of the protective device at an angle.

Interaction of reading head and actuator free of electric contact can be effected by all processes disclosed in the state of the art, in the simplest case by damping electromagnetic waves, in particular those of an electromagnetic field. As an alternative, a so-called transponder system can be used in which identification signals are exchanged between reading head and actuator free of electric contact. In the state of the art, the spatial response area of the interactive system is used only to a limited extent and such use requires relatively precise orientation of reading head and actuator when brought together.

Preferably, the reading head has a head housing on which the electromagnet and the first module are mounted so as to be stationary. As a result, electric contact, of the electromagnet in particular, is simplified.

Preferably, the actuator has the base element, the counterelement, and the second module. In particular, the actuator is made up of these elements. This movable configuration of the counterelement on the actuator is especially advantageous when the second module, as in the preferred embodiment of the invention, has no electric connecting lines.

The counterelement preferably may be pivoted about two axes relative to the base element, which axes together form a right angle. As a result, any desired angular displacement of the actuator relative to the reading head, and accordingly of the movable part of the protective device, may be compensated to a predetermined extent. To the extent that such is necessary or advantageous, the counterelement may be pivotable, in any event to a limited extent, about a third axis, which is determined in particular by the direction of spacing of counterelement and base element. The pivoting ranges may be limited by the geometric configuration of counterelement and/or base element by formation of mechanical stops, if necessary, in a different manner, relative to the three axes.

The counterelement essentially may not be displaced relative to the base element in the direction of their spacing. The locking is thus improved, since the possibility is precluded, in an attempt to open the protective device in the locked state, of first pressing the protective device together and accordingly of calling up "start" for the opening movement.

In one particular embodiment of the present invention, the range of rotation of the counterelement relative to the base element is restricted, especially about the axis determined by the direction of their spacing. This ensures preliminary orientation of the counterelement, and in particular, that of the associated module, and accordingly reliable interaction of reading head and actuator.

Preferably, there is mounted between the counterelement and the base element an elastically deformable element. Such element generates a force that may be applied to the counterelement to restore it to a base position relative to the base element. The elastically deformable element may be formed especially reliably and by especially simple means by a socket of rubber or plastic. A connecting element rigidly connecting the base element to the counterelement can extend through the deformable element.

In one particular form of an embodiment of the present invention, the electromagnet forms a first stop surface and the second counter element forms a second stop surface. The first stop surface may be brought to rest flat against the second stop surface during locking. High locking forces remaining over a long period may be reliably achieved as a result.

The first and second modules correspondingly form associated third and fourth stop surfaces which may be brought preferably into flat contact with each other during locking. This ensures dependable interaction of actuator and reading head.

Other objects, advantages and salient features of the present invention will become apparent from the following detailed description, which, taken in conjunction with the annexed drawings, discloses a preferred embodiment of the present invention.

BRIEF DESCRIPTION OF THE DRAWINGS

Referring to the drawings which form a part of this disclosure.

DETAILED DESCRIPTION OF THE INVENTION

Figure 1:
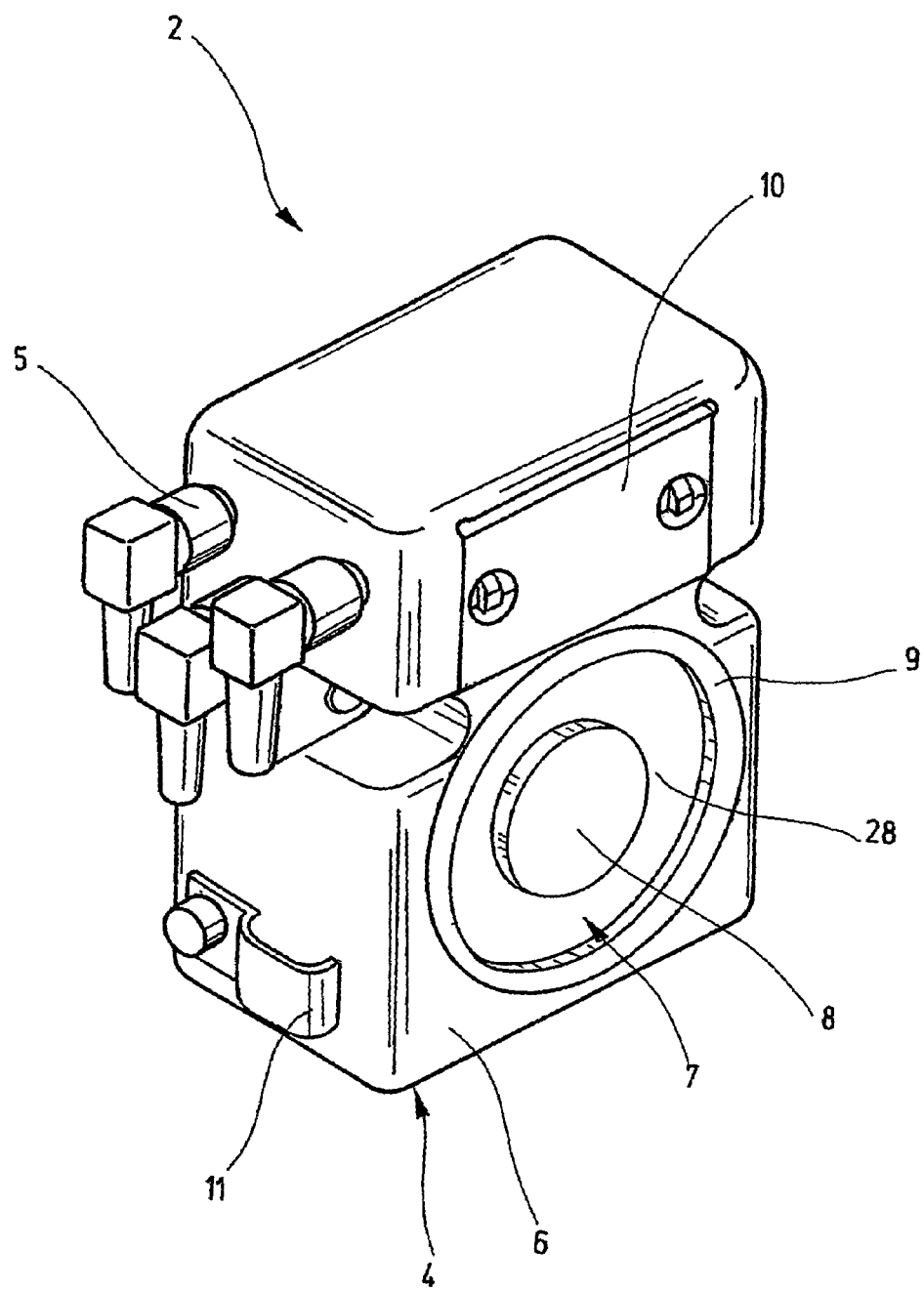
FIG. 1 is a perspective view of the reading head of a safety switch with a locking system according to an embodiment of the present invention.
Figure 4:
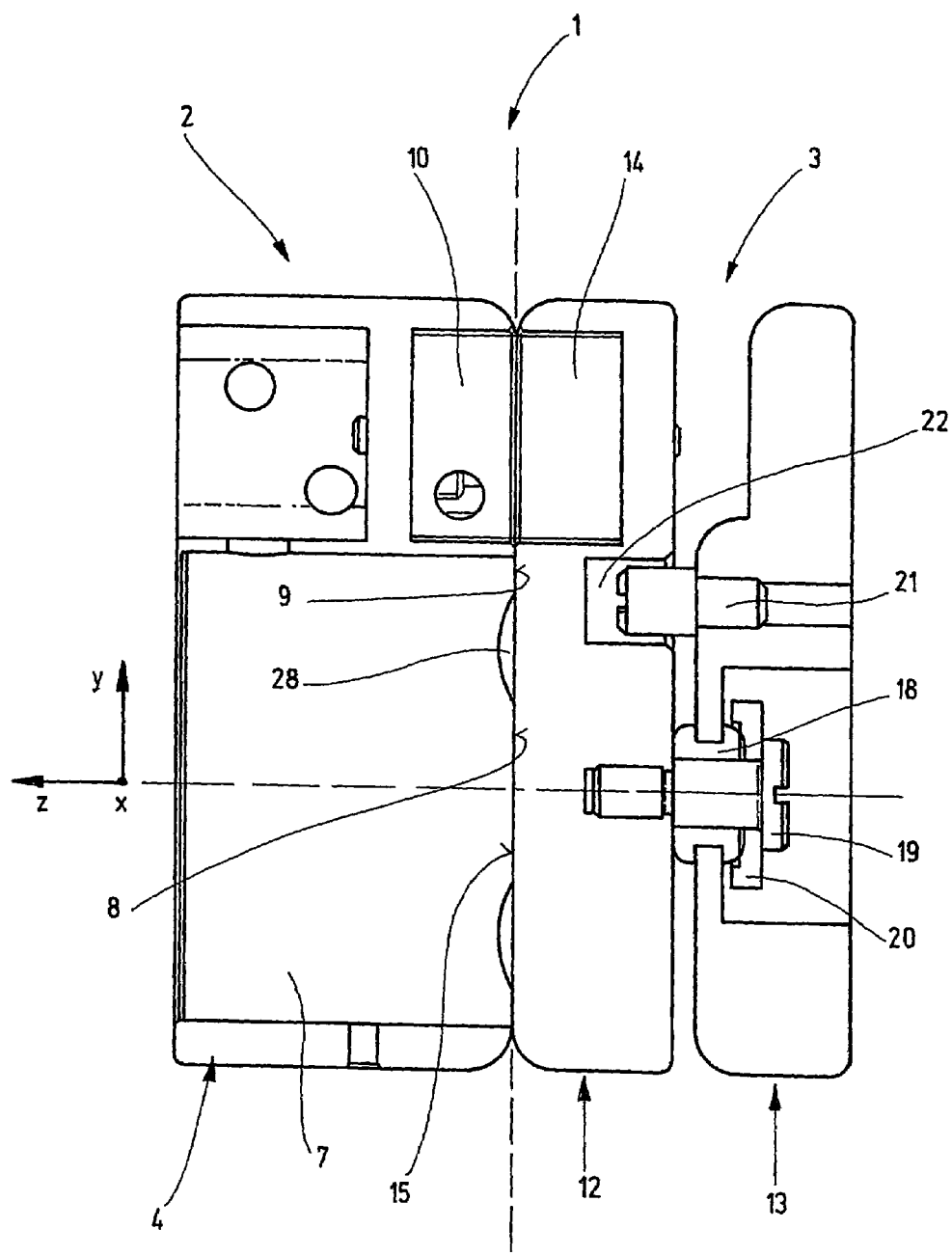
FIG. 4 is a side elevational view in section through the reading head and the actuator of the locking system of FIG. 1, when brought together.

FIG. 1 presents a perspective view of the reading head 2 of a safety switch with a locking system 1 of the present invention (FIG. 4). The reading head 2 is at least part of the safety switch. The electric switching function may be performed inside the head housing 4 or in a switching component of the safety switch distant from the head housing 4. Electric contact with the reading head 2 is established by one or more plug connectors 5. The head housing 4 is more or less square in shape, with a more or less rectangular frontal surface 6. In a lower area, the head housing 4 has a cylindrical bore whose longitudinal axis forms a right angle with the frontal surface 6. A electromagnet 7 may be introduced into that cylindrical base. In a preferred exemplary embodiment, the reading head 2 may be fixed by the head housing 4 to a frame of the protective device (not shown) or to the machine itself.

The electromagnet 7 has a more or less cylindrical housing. On its side facing the actuator 3, the electromagnet forms a more or less circular first stop surface 8. An annular edge 9, separated from the first stop surface 8 by an annular groove 28, is formed radially on the exterior of the housing of the electromagnet 7. The first stop surface 8, the annular edge 9, and the frontal surface 6 are preferably situated in a flat plane.

The first module 10 is mounted rigidly in the head housing 4 above the electromagnet 7. In particular, it is detachably connected to the head housing 4 by a screw connection. The wiring between the first module 10, the electromagnet 7, and the connection for the plug connector 5 preferably is extended inside the head housing 4. A cable clamp 11 for mounting the connecting lines for the plug connectors 5 is provided on a side surface of the head housing 4. The preferably flat frontal surface or third stop surface (FIG. 5) of the first module 10 is in alignment with the first stop surface 8 or is displaced slightly back from this surface.

Figure 2:
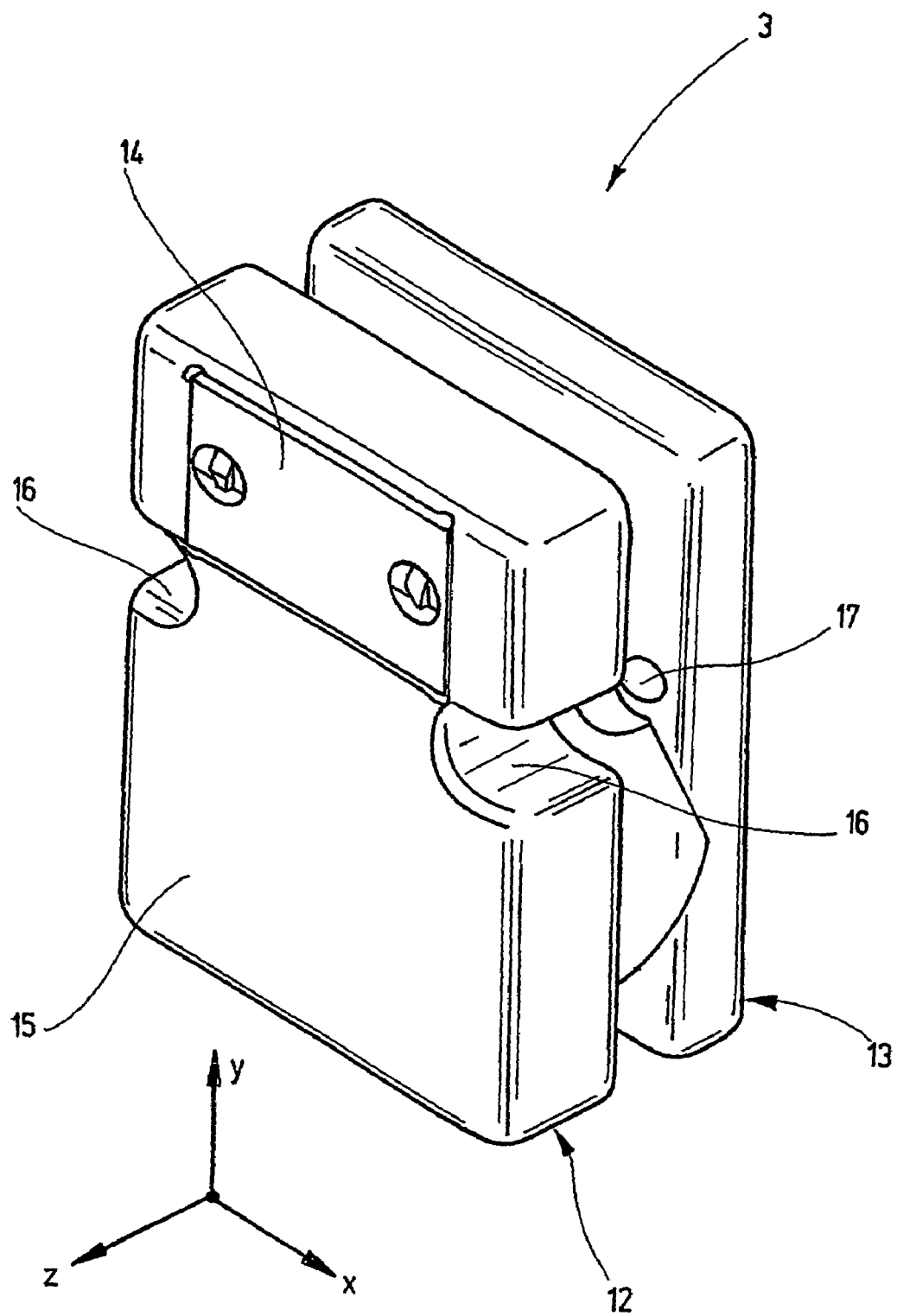
FIG. 2 is a perspective view of a pertinent actuator of the safety switch of FIG. 1.

FIG. 2 presents a perspective view of a pertinent actuator 3. The actuator 3 has a counterelement 12, of steel for example, by which the actuator 3 may be fixed on the reading head 2 by the electromagnet 7. Accordingly, the protective device is lockable. The counterelement 12 may be entirely of steel, or only partly so, for example, to form a frame of aluminum to receive an insert element interacting with the electromagnet. The counterelement 12 is rigidly connected to an associated base element 13, of aluminum, for example, but is pivotable relative to it, as explained in the following description in connection with FIGS. 3 to 5. The second module 14, which may be caused to interact with the first module 10 of the reading head 2 free of electric contact, is rigidly connected to the counterelement 12, preferably being detachable from the latter by means of fastening screws.

The counterelement 12 forms a flat second stop surface 15 which may be brought into flat contact with the first stop surface 8 of the reading head 2 during locking. The preferably flat frontal surface or fourth stop surface 24 (FIG. 5) of the second module 14 is in alignment with the second stop surface 15 or is offset slightly backward relative to it. The essential point is that the configuration of the first and second modules 10, 14 ensures contact of the first and second stop surfaces 8, 15 of the electromagnet 7 or of the counterelement 12, since this makes it possible to achieve especially high locking forces.

The actuator 3 is fixed, by the base element 13, for example, to a protective device for a machine which may be engaged and disengaged by the safety switch. Opposite this protective device, the counterelement 12, together with the second module 14, may be pivoted around the three directions or axes in space x, y, z, shown in FIG. 2 and forming a right angle with each other. The direction of spacing between counterelement 12 and base element 13 is represented by the direction in space z. In this direction of spacing, the counterelement 12 may in principle not be displaced relative to the base element 13. Both the counterelement 12 and the base element 13 are more or less square in shape and have rounded edges and corners. The recesses 16 in the form of grooves in the counterelement 12 provide access for fastening means, screws in particular, which may be introduced into the fastening holes 17 in the base element 13. The actuator 3 may be fixed by such screws to the movable part of the protective device.

In the exemplary embodiment illustrated, the second module 14 has no connecting lines, so that electric contact with the actuator 3 is not required. Preferably, energy is transmitted by way of the first module 10 mounted in the reading head 2 to the second module 14 in the actuator 3 in order to read out the identification data stored in the second module 14. The energy is then transferred back to the first module 10. In a simplified embodiment, the second module 14 may also merely attenuate an electromagnetic field generated by the first module 10, and accordingly, indicate to the reading head 2 the presence of the module 14 and the closed position of the protective device.

Figure 3:
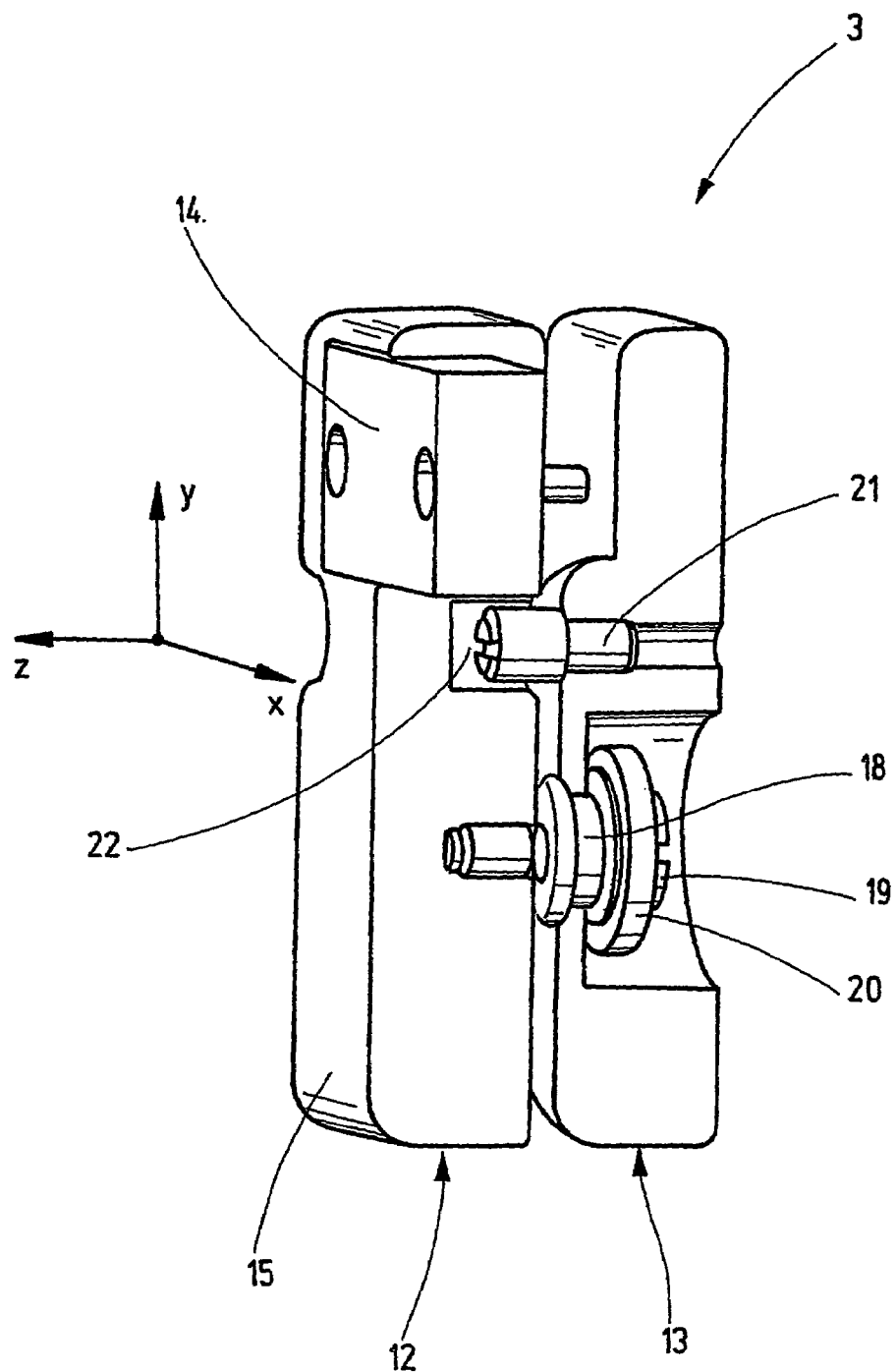
FIG. 3 is a perspective view in section through the actuator of FIG. 2.

FIG. 3 presents a perspective view of a section through the actuator 3. It illustrates in particular the coupling of the counterelement 12 on the base element 13. On the side facing away from the counterelement 12 the base element 13 has for this purpose a drilled hole. In the bottom surface 27 of the drilled hole (FIG. 5), a passage is provided leading to the side of the base element 13 facing the counterelement 12.

An elastically deformable element 18 is mounted in this passage and applies a force to counterelement 12 for resetting the counterelement 12 to a base position opposite the base element 13. In the exemplary embodiment illustrated, the elastically deformable element 18 is in the form of a socket of rubber or plastic through which extends a connecting element 19 joining the base element 13 with the counterelement 12. A plain washer 20 is mounted between the elastically deformable element 18 and the connecting element 19 to protect the element 18 from mechanical overload. In the exemplary embodiment illustrated, the connecting element 19 is a detachable and preferably self-locking connecting screw which may be screwed or threaded into a corresponding tapped hole in the counterelement 12.

The counterelement 12 may be pivoted about the z axis in the direction of spacing relative to the base element 13 only within a range predetermined by a mechanical stop mechanism. The mechanical stop mechanism, in the exemplary embodiment illustrated, is embodied in a stop screw 21, which may also be in the form of a headless screw, swivel, hard cylindrical pin, adapter sleeve, or the like. This stop screw 21 extends into an associated stop opening 22 which is situated in the surface of the counterelement 12 facing the base element 13. The geometric dimensions of the stop screw and the stop opening ultimately determine the range of pivoting about the z axis.

In one particular embodiment of the invention (not shown), the stop mechanism has a damping mechanism to prevent generation of noise during operation of the locking system 1 due to collision of the components of the stop mechanism. For example, the dampening mechanism can be provided by interposition of elastically deformable elements. In particular, for example, the stop screw 21 or a corresponding headless screw may have a damping O-ring mounted on it and/or a suitable damping ring may be mounted in the stop opening 22.

FIG. 4 shows a section in the y/z plane through the reading head 2 and the actuator 3 of the locking system 1 as assembled. The cross-section presented clearly shows the shape of the elastically deformable element 18, designed to be rotationally symmetric relative to the direction of axis z. The plain washer 20 is more or less cup-shaped and forms a stop especially during locking and the related transmission of force from the counterelement 12 by way of the connecting element 19 to the base element 13, and so from the reading head 2 to the actuator 3 or the protective device, and/or during tapping of the connecting element 19 and or during swivelling of the counterelement 12 relative to the base element 13. The deformable socket 18 is in the process in contact both with the base element 13 and the connecting element 12 and absorbs the tendency of the counterelement 12 to vibrate during the vibrations or impacts which occur to dampen development of noise such as rattling caused, for example, by impact of the counterelement 12 on the base element 13.

Figure 5:
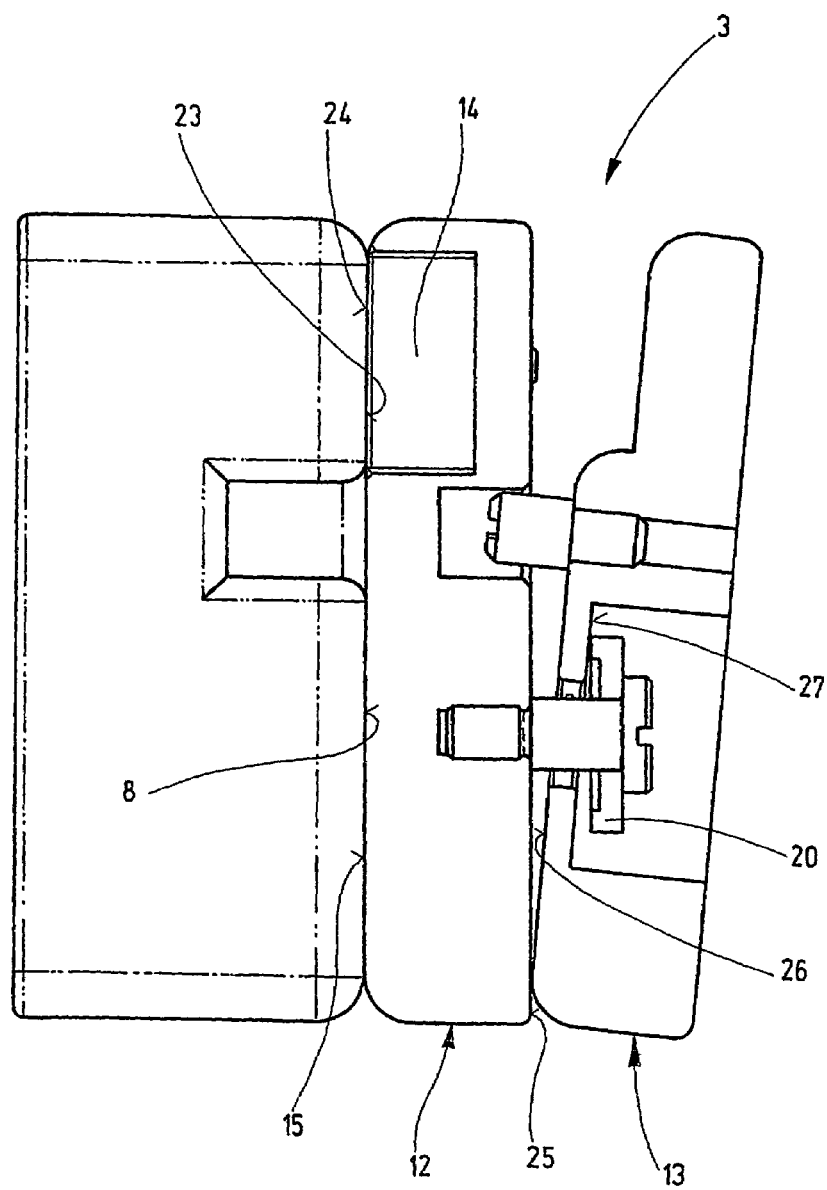
FIG. 5 is a side elevational view in section, similar to that in FIG. 4, but with the actuator moved back at an angle.

FIG. 5 presents a section similar to that in FIG. 4, but with the actuator 3 in a tilted position. For the sake of clarity, the elastically deformable element 18 is not shown in this drawing figure. It may be seen, however, that during the swivelling shown of the counterelement 12 relative to the base element 13, flat contact of the second stop surface 15 of the counterelement 12 with the first stop surface 8 of the electromagnet 7 and accordingly high locking forces are ensured. Correspondingly, the third stop surface 23 of the first module 10 makes flat contact with the fourth stop surface 24 of the second module 14. This contact ensures reliable electromagnetic interaction between the first module 10 and the second module 14.

The range of rotation of the counterelement 12 relative to the base element 13, in the case illustrated about the spatial direction or axis x perpendicular to the plane of the drawing in FIG. 5, is limited in that the surface 25 of the counterelement 12, projecting relative to the pivot axis and facing the base element 13, comes in contact with the frontal surface 26 of the base element 13 facing the counterelement 12. As an alternative or in addition, in this stop position the plain washer 20 comes into contact by its cupshaped edge with at least one place on the bottom surface 27 of the base element 13.

While one embodiment has been chosen to illustrate the invention, it will be understood by those skilled in the art that various changes and modifications can be made therein without departing from the scope of the invention as defined in the appended claims.

What is claimed is:

1. A locking system of a safety switch, comprising:
   a reading head having a first module with first electric components;
   an actuator having a base element;

an electromagnet connected to one of said reading head and said base element;

a counter element connected to the other of said reading head and said base element, said electromagnet releasably locking said actuator to said reading head by engaging and disengaging said counterelement;

a second module with second electric components that interact with said first electric components free of electrical contact therebetween to control the safety switch; and a coupling rigidly connecting at least one of said counterelement and said electromagnet to one of said base element and said reading head, while allowing pivoting relative to said base element.

2. A locking system according to claim 1 wherein said reading head comprises a head housing, said electromagnet and said first module being stationarily secured on said head housing.

3. A locking system according to claim 1 wherein said actuator comprises said base element, said counterelement and said second module.

4. A locking system according to claim 3 wherein said counterelement is pivotable relative to said base element about two perpendicular axes.

5. A locking system according to claim 3 wherein said counterelement is substantially not displaceable relative to said base element in a direction of spacing therebetween.

6. A locking system according to claim 3 wherein said counterelement is pivotable relative to said base element about an axis in a direction of spacing therebetween; and a stop mechanism limits pivoting of said counterelement relative to said base element.

7. A locking system according to claim 4 wherein said counterelement is pivotable relative to said base element about an axis in a direction of spacing therebetween; and a stop mechanism limits pivoting of said counterelement relative to said base element.

8. A locking system according to claim 7 wherein an elastically deformable element is mounted between said counterelement and said base element, and biases said counterelement toward a base position opposite said base element.

9. A locking system according to claim 8 wherein said elastically deformable element comprises a socket formed of rubber or plastic and a connecting element coupling said counterelement and said base element.

10. A locking system according to claim 6 wherein an elastically deformable element is mounted between said counterelement and said base element, and biases said counterelement toward a base position opposite said base element.

11. A locking system according to claim 10 wherein said elastically deformable element comprises a socket formed of rubber or plastic and a connecting element coupling said counterelement and said base element.

12. A locking system according to claim 1 wherein said electromagnet forms a first stop surface; and said counterelement forms a second stop surface, said first stop surface being engageable in flat contact with said second stop surface.

13. A locking system according to claim 12 wherein each of said first and said modules form a stop surface which are engageable in flat contact with one another during locking.

14. A locking system according to claim 1 wherein each of said first and said modules form a stop surface which are engageable in flat contact with one another during locking.

* * * * *